United States Patent
Dirsch et al.

(10) Patent No.: US 11,965,925 B2
(45) Date of Patent: Apr. 23, 2024

(54) TEST DEVICE FOR LOCALIZING A PARTIAL DISCHARGE IN OR AT AN ELECTRICAL COMPONENT AS WELL AS METHOD FOR LOCALIZING THE PARTIAL DISCHARGE

(71) Applicants: AUDI AG, Ingolstadt (DE); AUDI HUNGARIA Zrt., Gyor (HU)

(72) Inventors: Thomas Dirsch, Adelschlag (DE); Andreas Rauscher, Altmannstein (DE); Peter Sipos, Gyor (HU); Peer Stenzel, Ingolstadt (DE)

(73) Assignees: AUDI AG, Ingolstadt (DE); AUDI HUNGARIA ZRT., Gyor (HU)

( * ) Notice: Subject to any disclaimer, the term of this patent is extended or adjusted under 35 U.S.C. 154(b) by 0 days.

(21) Appl. No.: 17/950,661

(22) Filed: Sep. 22, 2022

(65) Prior Publication Data
US 2023/0091492 A1     Mar. 23, 2023

(30) Foreign Application Priority Data
Sep. 23, 2021   (DE) ............... 10 2021 124 670.9

(51) Int. Cl.
*G01R 17/16*   (2006.01)
*G01R 31/12*   (2020.01)
*G01R 31/16*   (2006.01)

(52) U.S. Cl.
CPC ..... *G01R 31/1209* (2013.01); *G01R 31/1218* (2013.01); *G01R 31/16* (2013.01)

(58) Field of Classification Search
CPC .......... G01R 31/16; G01R 31/1209; G01R 31/1218; G01R 31/1227; G01R 31/1272;
(Continued)

(56) References Cited

U.S. PATENT DOCUMENTS

| 2005/0243649 A1* | 11/2005 | Kuppuswamy .... G01R 31/1209 367/118 |
| 2012/0130663 A1* | 5/2012 | Madhukar ............. G01R 31/62 702/65 |

(Continued)

FOREIGN PATENT DOCUMENTS

| DE | 11 2013 005 707 B4 | 12/2018 |
| DE | 10 2021 124 670.9 | 9/2021 |

(Continued)

OTHER PUBLICATIONS

Examination Report dated May 31, 2022 in German Patent Application No. 10 2021 124 670.9 (8 pages).

*Primary Examiner* — Thang X Le
(74) *Attorney, Agent, or Firm* — STAAS & HALSEY LLP (57) ABSTRACT

A test device to localize a partial discharge in or at an electrical component may include at least one antenna to capture an electromagnetic wave caused by a partial discharge in the electrical component. The test device includes multiple microphones arranged in an environment around the electrical component. The microphones capture sound waves caused by the partial discharge. It is examined if an intensity of the electromagnetic wave exceeds a first limit value and/or the intensity of the sound wave captured by one of the multiple microphones exceeds a second limit value. Depending on the captured sound wave and/or the electromagnetic wave and on the examination relating to the first and/or second limit value, a location of the partial discharge can be determined.

15 Claims, 4 Drawing Sheets

(58) Field of Classification Search
CPC ............ G01R 31/1245; G01R 31/1254; G01R 31/1263; G01R 31/081; G01R 31/083; G01R 31/52; G01R 31/58; G01R 31/62
See application file for complete search history.

(56) References Cited

U.S. PATENT DOCUMENTS

| | | | |
|---|---|---|---|
| 2012/0265458 A1 | 10/2012 | Agapiou et al. | |
| 2013/0033214 A1* | 2/2013 | Obata | G01R 31/1227 324/765.01 |
| 2014/0180617 A1* | 6/2014 | Obata | H02K 3/00 310/179 |
| 2015/0304487 A1* | 10/2015 | Chaput | F16B 2/10 29/854 |
| 2021/0281207 A1* | 9/2021 | Mueller | G01R 31/343 |
| 2022/0006279 A1* | 1/2022 | Robles | H02H 1/0015 |
| 2022/0018887 A1* | 1/2022 | Hencken | G01S 11/16 |

FOREIGN PATENT DOCUMENTS

| | | | |
|---|---|---|---|
| JP | 08122388 A | | 5/1996 |
| JP | 2010210574 | * | 9/2010 |

* cited by examiner

TEST DEVICE FOR LOCALIZING A PARTIAL DISCHARGE IN OR AT AN ELECTRICAL COMPONENT AS WELL AS METHOD FOR LOCALIZING THE PARTIAL DISCHARGE

CROSS-REFERENCE TO RELATED APPLICATIONS

This application claims the priority benefit of German Application No. 10 2021 124 670.9 filed on Sep. 23, 2021, which German Application is herein incorporated by reference in its entirety.

FIELD

The present application relates to a test device for localizing a partial discharge in or at an electrical component. Furthermore, the present application includes a method for localizing the partial discharge in or at the electrical component.

BACKGROUND

In the course of the increasing electrification of the road traffic, electric drives are increasingly employed in vehicles as well as motor vehicles. Therein, the so-called phenomenon of the partial discharge presents a particular challenge in the development and production of associated electric drives. The partial discharge is in particular partial discharges in gaseous media between adjacent conductors, which have a potential difference and a low distance to each other. If partial discharges occur, thus, an insulation of the conductors can be abrasively attacked and a breakdown can occur. As a result, a drive for a motor vehicle could fail. Therefore, low-voltage machines are mostly developed such that partial discharges only start at a very high voltage limit to avoid an occurrence in the operation over the lifetime of the drive. Partial discharges are in particular undesired in stators as the electrical components.

The utility model document DE 20 2020 105 657 U1 relates to a device for testing components of electrical machines, in particular stators and rotors. For testing stators, test contacts are provided, which protrude from a bar. The test contacts can be coupled to test contacts of a contacting unit electrically connected to the stator. For testing, a test chamber can be employed.

In particular in stators, electrical partial discharges are undesired. Due to the electrical partial discharge, a breakdown in the form of discharge currents can occur. In the worst case, the drive of the motor vehicle can fail. In the production or manufacture of electrical drives, it is therefore relevant to reveal possible flaws with respect to the partial discharges already in advance.

SUMMARY

Therefore a way of ascertaining possible positions or locations for partial discharges in or at an electrical component is described.

A precise and repeatable partial discharge measuring technology is of great value. Therein, it is not only relevant, from which voltage partial discharges occur, but a location of the partial discharge at the electrical component can additionally be specified. The partial discharges best are to be able to be determined with respect to a partial discharge voltage limit and a localization at the electrical component. Previous systems for measuring partial discharges restrict themselves only to the phases in a stator upon a localization of a flaw.

In an example, a test device for localizing a partial discharge in or at an electrical component is provided. The electrical component can be an electrical drive or a stator for the electrical drive. In particular, the test device can be coupled or connected to the electrical component. In particular, the test device comprises one or more antennas for capturing an electromagnetic wave, which is caused by a partial discharge in the electrical component. In particular, a partial discharge represents a moved charge, which generates the electromagnetic wave. This electromagnetic wave can be registered by at least one of the multiple antennas. Therefore, the multiple antennas may be configured such that they are adapted with respect to their frequency range to capture electromagnetic waves by partial discharges. The frequency range of these antennas can for example be between 300 megahertz and 3 gigahertz. In an example, the multiple antennas may be positioned in a preset environment around the electrical component. In particular, the multiple antennas may each positioned on opposing sides of the electrical component.

The test device can comprise multiple microphones, which may be arranged in the preset environment around the electrical component. The multiple microphones can be arranged on respectively opposing sides of the electrical component similar to the multiple antennas. In particular, the multiple microphones are formed to capture acoustic sound waves caused by the partial discharge. In particular, the multiple microphones can be sensitive in a preset frequency range for the sound waves caused by the partial discharge. The frequency of such acoustic sound waves can be in a range between about 10 kHz and 400 kHz. Thus, each microphone can be designed to detect sound waves in the range between 30 kHz and 400 kHz. Thereby, a majority of the acoustic sound waves can be outside of a range audible to humans.

In a first example, the test device comprises at least one antenna, for example, exactly one antenna, as well as at least 2, for example, at least 3, further at least 10 or 20 microphones. In a second example, the test device comprises at least 2 antennas, for example, exactly 2 antennas, and no microphone.

By suitable arrangement of the microphones and/or antennas, with an electrical component with two winding heads, each of which can include multiple coil heads, in particular such that at least one first microphone and/or at least one first antenna are associated with a first winding head and at least one second microphone and/or a second antenna are associated with a second winding head, i.e. are arranged closer to the associated winding head than to the other winding head, it can already be ascertained, at which winding head the determined partial discharge may have occurred. This result is already sufficient for a plurality of applications. However, a more accurate localization of the partial discharge on the concerned winding head may not be required for a plurality of applications, but can be allowed in using a greater number of antennas and/or microphones within the scope of the present described examples.

Additionally or alternatively to the multiple microphones, the test device can comprise a video camera to localize the location of the partial discharge. The video camera can be formed as a UV camera. Accordingly, the video camera can be sensitive in the UV range, thus capture light in the UV range. The video camera can create an image sequence and/or a video sequence, which shows the electrical component. Based on the image sequence and/or video sequence, the location of the partial discharge can be at least approximately determined. Thereto, an optical filter can for example be employed within the scope of an image evaluation. By the optical filter, bright areas in the image sequence and/or video sequence can be detected. Thereby, light flashes caused by the partial discharge can be at least approximately locally determined. Thus, a light flash can be optically captured by the video camera and the location of the partial discharge can be at least narrowed down based thereon. It is possible that multiple video cameras are employed thereto.

The test device can comprise a control unit, which is formed to apply the electrical component with a voltage signal. The voltage signal can be formed as a high voltage, voltage pulse or as a sinusoidal voltage. Thereby, the application to the electrical component can be effected with different types of voltage signals. Depending on the electrical component, a certain voltage signal can be selected or preset. The term "voltage signal" can include various types of the voltage excitation. The term "voltage pulse" is a more concrete form of the voltage signal, however, these two terms can be regarded as synonyms.

The control unit can examine if the intensity of the electromagnetic wave captured by the antenna exceeds a first limit value to determine the partial discharge. Based on this examination, the partial discharge in itself can be determined. Based on the captured intensity of the electromagnetic wave as well as a distance of the electrical component to the one or more antennas, the location of the partial discharge can be approximately ascertained. In an example, the sound waves captured by the multiple microphones may be analyzed for a more accurate location determination of the partial discharge.

The capture of the electromagnetic wave by the antenna can be restricted in a preset frequency range. In an example, the preset frequency range may correspond to a range, in which electromagnetic waves of partial discharges occur. Depending on the captured sound wave and/or the electromagnetic wave, a location of the partial discharge can be determined or ascertained for the localization. For localization, an amplitude of the sound wave (volume) can in particular be taken into account. In addition, the examination relating to the respective limit value can be taken into account. The examination with respect to the first and/or second limit value can ensure that a partial discharge may actually be detected. The location of the partial discharge, the localization of the partial discharge can be ascertained with the aid of the volume and/or with the aid of a field strength measured by the one or more antennas. Thereto, the one or more antennas can measure or capture an electric and/or magnetic field strength. From this measurement, a voltage value can be derived, which can be compared to the first limit value. Thus, the voltage value preferably represents a quantity or parameter measured by the antennas. This parameter is in particular the electric and/or magnetic field strength or correspondingly the associated flux density. Based on the parameter captured by the antennas, the location of the partial discharge can be at least approximately ascertained. Additionally considering the measured sound wave by the microphones, the location determination can be further more precisely stated. Thus, the sound wave and/or the electromagnetic wave can be taken into account in localizing.

According to whether the sound wave, the electromagnetic wave or both are taken into account, the first limit value or second limit value or both limit values may be used in the examination with respect to an existence of the partial discharge. The first and/or the second limit value may serve for determining if a partial discharge has occurred. The first limit value in particular relates to the electromagnetic wave and the second limit value in particular relates to the sound wave. The first limit value can relate to a (first) voltage value, wherein the voltage value can in particular be derived from the electric field strength (volts per meter).

The second limit value can relate to a volume (decibel). In this case too, a further (second) voltage value can be derived based on the measured volume. This second voltage value can be compared to the second limit value. With the sound wave and/or the electromagnetic wave, a respective intensity of the wave with respect to the first and/or second limit value can in particular be compared for the examination. In an example, the examination involves a comparison of the intensity of the sound wave and/or the electromagnetic wave to the first and/or second limit value. If one of these two limit values is exceeded, thus, a partial discharge can be present. In particular, the examination can provide that a partial discharge is assumed and the location of the partial discharge is ascertained only upon exceeding both limit values. In an example, for the first limit value, an electromagnetic limit value may be relevant to the determination of the partial discharge. The acoustic sound wave may be used for the location determination of the partial discharge if the electromagnetic limit value is exceeded.

In an example, the location of the partial discharge may only be ascertained if the respective intensity of the sound wave and/or electromagnetic waves exceeds the first and/or second limit value. The location of the partial discharge may only be ascertained if the partial discharge is previously determined based on the first and/or second limit value. The location can be at least approximately ascertained depending on the captured volume by the microphones and/or on the captured electric and/or magnetic field strength. Therein, the volume can also be used as an indication of the existence of the partial discharge. In an example, the partial discharge may be determined by the one or more antennas. In addition, the occurrence of the partial discharge can also be effected considering a volume. This in particular corresponds to exceedance of the volume or the second voltage value beyond the second limit value.

In ascertaining the location of the partial discharge, a direction of propagation of the sound wave and/or electromagnetic wave can be taken into account. In the localization, the captured sound wave and/or electromagnetic wave as well as their characteristics may only taken into account if the examination yields exceedance of the intensity beyond the first or second limit value. A spatial intensity distribution, a direction of propagation, a velocity of propagation, a transit time difference between the antennas or microphones etc. can be among these characteristics. Thereby, not only the partial discharge in itself, but additionally a location of the partial discharge can be at least approximately specified. A defective location of an electrical drive can thus be determined before startup and the drive can optionally be repaired.

In particular, the control unit can increase the voltage signal by a preset amount if an electromagnetic wave is not detected by an antenna and/or an acoustic sound is not detected by a microphone. The control unit can increase the voltage signal respectively by the preset amount until either a partial discharge in the form of an electromagnetic wave and/or an acoustic sound is registered or a maximum termination voltage is reached. A voltage value of the voltage signal can be incrementally increased.

For generating the voltage signal, the test device can comprise a high-voltage generator, which may be controllable by the control unit. The control unit can generate pulse-shaped or sinusoidal voltage signals through the high-voltage generator. Such voltage signals can be represented and/or visualized by an evaluation module as well as corresponding filters and an evaluation software. The electromagnetic waves may be captured by ultrahigh-frequency antennas. Alternatively, the electromagnetic wave can also be captured in wired manner instead of the multiple antennas. The control unit can apply a phase to be tested, for example the phase U, against V and W, with a voltage signal. U, V and W represent the three phases of a three-phase current.

The one or more antennas can send a received signal, in particular the electromagnetic wave, to the control unit. The control unit can subject signals communicated by the multiple antennas and multiple microphones to a filtering. The control unit can use the filtered signal for examining the intensity of the electromagnetic wave. This can analogously apply to signals filtered by the microphones. If the control unit does not determine an electromagnetic wave and acoustic sound wave, which indicate partial discharges, and if the voltage value of the voltage signal is below a preset limit value, thus, the control unit can continue the examination with an incrementally higher voltage value. In an example, this may occur until either a partial discharge is registered or a preset termination voltage is reached. In this manner, the three phases of the stator as the electrical component, U, V and W, can in particular be examined one after the other. Thereby, an own voltage limit value for the partial discharge can be determined for each phase. In an example, that phase with the lowest voltage limit value may represent the insulating flaw. In association with the captured sound waves, not only the voltage limit for the partial discharge can be specified, but the location of the partial discharge can additionally be at least approximately determined. Thus, the partial discharge can be localized. This realization can be of great value in particular in the development phase, but also in the production of electrical drives.

An additional or alternative example may be a test device with a camera. The camera may serve for optically capturing an electrical component by an image. In an example, the control unit may be formed to display the location of the partial discharge in the image. In an example, this can be realized in that the location of the partial discharge is ascertained based on the captured sound waves of the individual microphones and this location is associated in the image of the camera. The camera can be formed as a video camera. In this embodiment, the camera can in particular cooperate with the multiple microphones and thus display or visualize the location of the partial discharge in the image of the camera. The camera can be formed as an acoustic leakage detection camera, which is employable for partial discharge detections. This means that the camera and the multiple microphones can represent a common sensor unit. The multiple microphones can be formed as directional microphones. Instead of the camera, a display or monitor of the control unit can be used to visualize the location of the partial discharge. In this case, the monitor may correspond to the image of the camera.

An additional or alternative example provides that the multiple microphones are respectively arranged on opposing sides of the electrical component and/or circularly around the electrical component. In an example, the multiple microphones are arranged in defined positions in relation to the electrical component. The control unit can additionally ascertain the location of the partial discharge depending on a position of the respective microphones in relation to the electrical component and a captured volume of the respective measured sound waves. The volume in particular may correspond to the intensity of the sound wave. For example, 30 directional microphones can be circularly arranged around the electrical component. In particular, each microphone, which detects the greatest volume of the sound wave caused the partial discharge, can be arranged closest to the partial discharge. Based on the respective signals, which the directional microphones or microphones receive, the location of the sound wave or acoustic wave can be determined. This location can in turn be displayed in the image of the camera or a display device, which shows the electrical component.

Since the control unit applies the electrical component with the voltage signal, it may become known, at which voltage the partial discharge is detected. Thus, the partial discharge in itself can be detected on the one hand and moreover the location of the partial discharge can be at least approximately determined by the directional microphones and/or the captured electromagnetic waves. The camera cannot only optically capture the electrical component, but record it by a film. Thus, the camera can capture multiple images of the electrical component, wherein the multiple images are respectively captured at different points of time. In this case, a point of time can additionally be ascertained, at which the partial discharge is detected. This point of time can be associated with one of the multiple images of the camera. Thus, a significant image can for example be selected from a time range, in which the partial discharge is detected. Thus, a quantitative voltage value and an acoustic emission value can be associated with each other. These two pieces of information can provide information about a voltage limit for the partial discharge as well as the location of the partial discharge, thus a flaw in the electrical component. In this example, the camera can be referred to as an acoustic camera. Thus, a partial discharge can be discovered and be locally localized at the same time. Moreover, the localization can be visually displayed.

It is possible to perform the capture of the electromagnetic wave and/or the capture of the sound wave in synchronized manner. With respect to all of the measurements, a point of time can respectively be captured. With the aid of the respective point of time, the measurements can be temporally matched with each other and the capture with respect to the electromagnetic wave and the sound wave can be synchronized, respectively. This time information can for example be used for the location determination within the scope of a transit time difference.

An additional or alternative example may be that the control unit is formed to iteratively incrementally increase the voltage signal until the electromagnetic wave captured by one of the multiple antennas exceeds the limit value or the voltage signal reaches a maximum value. In particular, the electrical component can be evaluated based on a preset number of voltage signals to generate the partial discharge. Thereto, a probability function for partial discharges based on a strength of the voltage signal can for example be ascertained. At the same time, a dispersion of partial discharge events could be determined. A correlation between voltage signals and the occurrence of partial discharges can also be obtained.

With a functional electrical component, a partial discharge should not be detected at a voltage signal below the tolerance voltage. The partial discharge can be registered either by capturing acoustic sound waves and/or by capturing the electromagnetic waves by the antennas. If both are not determined, thus, it can be assumed that a partial discharge is not yet present with respect to the applied voltage signal. In the further course, the control unit can increase the voltage signal by a preset amount and again apply it to the electrical component. This procedure may be continued up to the maximum value with respect to the voltage signal. With a faultless electrical component, a partial discharge is not determined below the tolerance voltage. This may correspond to the ideal case and the electrical component can be approved to the production. The previously mentioned advantages and examples correspondingly apply to this example.

With respect to the voltage signal, a lower tolerance voltage can be set in addition to the maximum termination voltage. Based on a level of the voltage signal (voltage value), at which a partial discharge is determined, an evaluation of the electrical component can be effected. The control unit can initiate this evaluation. If the partial discharge occurs at a voltage value below the tolerance voltage, thus, the electrical component is classified as potentially defective. At a voltage value greater than the tolerance voltage, at which the partial discharge occurs, the electrical component may be categorized as acceptable. In particular, only voltage signals with a voltage value up to a maximum termination voltage may be employed. Partial discharges, which are determined between the tolerance limit and the maximum termination voltage, can be used for a statistical analysis, correlation formation or other evaluation.

If a partial discharge in the form of sound waves or in the form of electromagnetic waves is determined, thus, the location of the partial discharge can be ascertained with the aid of the various described examples. At the same time, the voltage signal applied by the control unit as well as the associated voltage value may become known. Thereby, an association between the individual electrically/electromagnetically detected electromagnetic waves and the acoustically localized events can be effected. Defective electrical components can thus be recognized in advance and optionally be brought to a new repair.

An additional or alternative example may be a test device with an electrical component. The electrical component in particular comprises multiple windings. The multiple windings can each comprise multiple phases. These phases in particular may represent separated partial areas of the electrical component or of the windings. In addition, each phase can in turn be subdivided into multiple parallel branches. Thus, the parallel branches in particular may represent a subunit of the phase, while the phases may represent a subunit of the winding. The respectively multiple phases can be individually applied with the voltage signal. Thereto, the control unit can be configured to apply the voltage signal to different phases and to additionally ascertain the location of the partial discharge considering the phases applied with the voltage signal.

The respective branches or the phases can be individually applied with the voltage signal by respective slip-in coils, round wires, flat wires and/or cable lugs. The slip-in coils may sometimes also be referred to as hairpins. A hairpin can be a U-shaped wire element, which allows an electrical access to a branch of the respective phase. Each slip-in coil, round wire, flat wire and/or cable lug can be electrically connected to a preset winding or phase. Similarly, this can apply to the respective parallel branches of the phase. The slip-in coil, round wire, flat wire and/or cable lug in particular may represent an electrical access to a preset winding. This means that the voltage signal does not relate to the entire electrical component, but only to the associated phases of the windings. Even if the windings are subdivided into different phases, the entire electrical component can still be applied with the voltage signal. For example, a first phase could be interconnected with all of the further phases. The further phases can be interconnected to a common phase and form a required electric circuit for the voltage signal together with the first phase. With the usual phases U, V, W, the following interconnections would for example be possible: U-(VW), V-(UW), W-(VU). Therein, the phases in parentheses may represent a common phase. The winding can comprise two, three or more than three phases. In this manner, individual partial areas of the electrical component as well as the entire electrical component can be applied with the voltage signal.

Thus, not only different phases can be examined with respect to the partial discharge, but moreover different partial areas of the electrical component can be examined with respect to the partial discharge. Thereby, a more precise knowledge with respect to the location of the partial discharge can be obtained. In an example, this is due to the fact that the location of the partial discharge can be spatially narrowed down in the area of the windings already in advance due to the phases. In particular, ascertaining the partial discharge can be focused on already known flaws of the electrical component.

Additionally or alternatively, it can be provided that the control unit is formed to apply a plurality of voltage signals to each exactly two phases according to a switching matrix and to ascertain the location of the partial discharge relating to these two phases. Therein, immediately consecutive voltage signals can in particular be applied to the two different phases. Furthermore, a first branch of a first phase can be electrically connected to a second branch of a second phase to apply the voltage signal. Thereby, many different combinations can be allowed for applying with the voltage signal. Thus, a second branch of a first phase can be connected to a fifth branch of a third phase. The features and advantages with respect to the described example with the phases can be correspondingly transferred to this example.

By combinatorics, possible connections per two branches can be determined by the possible permutations. Therein, an order of the phases or branches can additionally be taken into account. A plurality of voltage signals can respectively be applied to phases or branches in permutating manner. Therein, a preset set of possibilities of phase pairs and/or branch pairs may be processed. Thereto, multiple terminals in the form of round wires, flat wires etc. can be employed. With exactly three phases, three permutations can result if an order remains unconsidered. A theoretical number of possible permutations in particular results based on the combinatorics. If each two branches are electrically connected to each other, thus, the switching matrix may only contains those combinations of two branches, which are associated with different phases. The control unit is in particular designed to apply the voltage signals one after the other to the respectively two phases or branches according to the switching matrix. Each two phases or branches can be referred to as a phase pair or branch pair.

The slip-in coils, flat wires, round wires and/or cable lugs can be arranged at stators. The stators can be constructed by bent flat conductors. The location of the partial discharge can be limited to the respective windings to the phases or branches. With the aid of the captured sound waves and/or the captured electromagnetic waves, the location of the partial discharge can be stated more precisely.

An additional or alternative example may be that the location of the partial discharge is at least approximately ascertained by a respective transit time difference of the sound waves captured by the microphones. By an evaluation of the amplitudes or intensities of the sound waves, thus of the volume, it is possible to state the location of the partial discharge more precisely. An evaluation of the transit time differences of the sound waves between the individual microphones allows more precisely stating the location of the partial discharge. According to number of the used microphones, an accuracy of the localization with respect to the partial discharge can be increased. This example can be correspondingly and analogously transferred to the electromagnetic waves examples. In this case, an evaluation of the transit time differences relating to the electromagnetic waves between the individual antennas can be effected.

An evaluation of received electromagnetic waves, which can be synchronously detected by the differently positioned antennas, can be determined if the electromagnetic signal originates substantially from one side of the electrical component or from an opposing side. The amplitudes of the electromagnetic waves can be normalized to a background noise and be correspondingly evaluated. Instead of the intensity, the amplitude can be used. The intensity may be proportional to the square of the amplitude. This may apply to all of the embodiments and examples. An evaluation can for example be effected by plotting the amplitudes of the electromagnetic waves normalized to the background noise. A diagram resulting from it can be evaluated with respect to the location of the partial discharge. An accuracy of this localization can be increased by the employment of additional antennas.

An additional or alternative example may be a test device with a first antenna and a second antenna. These two antennas may be arranged on opposing sides of the electrical component. The control unit is in particular formed to at least locally narrow down the location of the partial discharge based on a captured first intensity of the electromagnetic wave by the first antenna and a captured second intensity of the electromagnetic wave by the second antenna. In this case, the two antennas can each be positioned on the side of a stator. The stator may represent the electrical component. The first antenna can capture the first intensity of the electromagnetic wave caused by the partial discharge. Similarly, the second antenna can capture the second intensity of this electromagnetic wave. That antenna, which captures a greater intensity, may indicate on which side of the stator the partial discharge has occurred.

Measuring the partial discharge can be repeated, wherein the two antennas can be rotated around the stator or the electrical component. Thus, by applying voltage signals, the location of the partial discharge can be indicated more detailed by means of multiple measurements. This example may offer the advantage that despite of only two antennas, more precise information with respect to the location of the partial discharge can nevertheless be obtained by a rotation of the two antennas around the electrical component. The rotation of the two antennas may be effected such that the two antennas are each arranged on opposing sides of the electrical component. The rotation can relate to multiple planes, thus is not only restricted to one plane, and can extend to all three dimensions.

An additional or alternative example may be that the microphones are formed as directional microphones. The antenna can be formed as an ultrahigh-frequency antenna, a so-called UHV antenna. The electrical component can be a stator of an electric motor for a motor vehicle. The control unit can be formed as a test appliance for detecting partial discharges. The control unit can include a screen or monitor. With the aid of the monitor, a location of the partial discharge can be visually presented. In addition, the test device can comprise a camera, which is formed as an acoustic camera and/or video camera. With the aid of the camera, a visual presentation of the location of the partial discharge can be correspondingly allowed.

An example may be a method for localizing a partial discharge in or at an electrical component. The method may, for example, include, first an electromagnetic wave caused by a partial discharge in the electrical component is captured by multiple antennas and/or an acoustic sound wave caused by the partial discharge is captured by multiple microphones. Thereto, a voltage pulse can be applied to the electrical component in advance. Acoustic sound waves can be captured by multiple microphones, wherein the multiple microphones may be positioned in a preset environment around the electrical component. Similarly, the multiple antennas can be arranged in the preset environment around the electrical component. By a control unit, it can be examined if the electromagnetic waves captured by the antennas exceed a first limit value. Thereby, it can be examined if a partial discharge has occurred at all. A location of the partial discharge can be ascertained depending on the captured sound waves and the examination relating to the limit value to localize the partial discharge. Alternatively, the location of the partial discharge can be visually presented on a display or a monitor.

The features as well as the advantages of examples presented in context of the test device for localizing the partial discharge may apply to the examples of a method for localizing the partial discharge and vice versa.

In an example, the test device comprises the control unit. The control unit can comprise a processor device, which is configured to perform an example of a method. Hereto, the processor device can comprise at least one microprocessor, at least one microcontroller, at least one FPGA (Field Programmable Gate Array), at least one DSP (Digital Signal Processor) and/or a neural network. Furthermore, the processor device can comprise a program code, which is configured to perform the described examples of the method upon execution by the processor device. The program code can be stored in a data storage of the processor device. The control unit can include an internal or external storage unit. The external storage unit can be formed as a Cloud unit.

The test device can include a computer program [product], which may include commands, which cause each described example of the method to be executed. The computer program product can be stored on a computer-readable medium.

Developments of the method according to an example, which comprise features, as they have already been described in context of the developments of the test device, also belong to the described examples. For this reason, the corresponding developments of the method according to the described examples may not again described here.

The electrical component may be formed as an electric drive for an automobile, in particular a passenger car or truck. The electrical component can be a stator.

The described examples also include the combinations of the features of the described examples. Thus, the examples also include realizations, which each comprise a combination of the features of multiple of the described examples if the described examples have not been described as mutually exclusive.

Now, examples are explained in more detail based on attached drawings. Therein, it is to be noted that the drawings may only indicate exemplary possibilities, how the examples can be realized. Individual features based on the drawings as well as on the described examples can be extracted and combined with other described examples. In no event, the drawings are to be regarded as limiting restrictions of the examples.

BRIEF DESCRIPTION OF DRAWINGS

These and other aspects and advantages will become more apparent and more readily appreciated from the following description of the examples of an invention, taken in conjunction with the accompanying drawings of which.

DETAILED DESCRIPTION

The embodiments explained are examples of an invention. In the embodiments, the described components of the examples each represent individual features to be considered independently of each other, which also each may be developed independently of each other. Therefore, the disclosure is to include also combinations of the features of the examples different from the illustrated ones. Furthermore, the described examples can also be supplemented by further ones of the already described features of the examples.

In the figures, identical reference characters each denote functionally identical elements.

Figure 1:
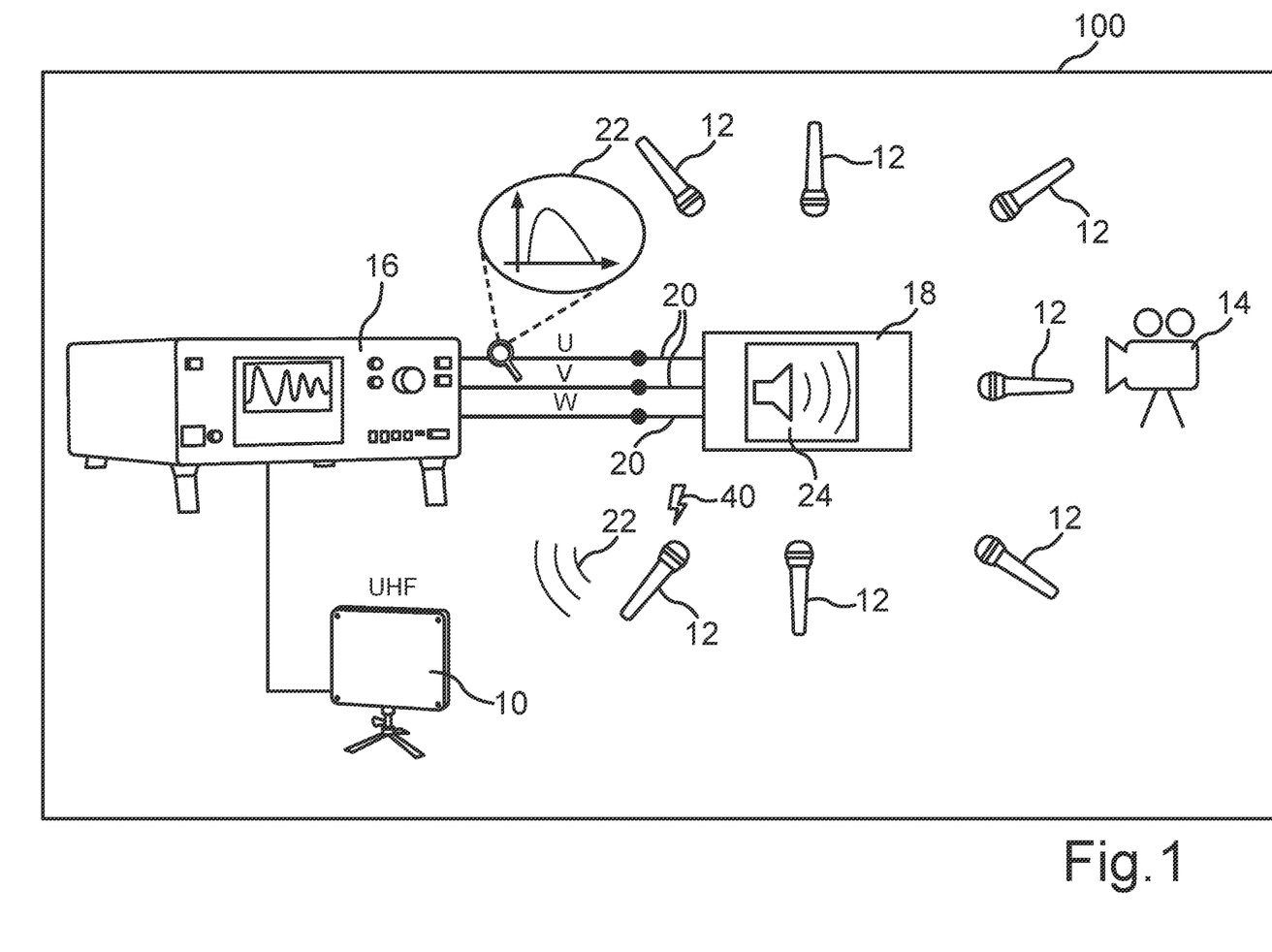
FIG. 1 is a diagram of an overview of a test device for determining partial discharges as well as a location of the partial discharges.

In FIG. 1, a test device 100 is exemplary shown. The test device can comprise a control unit 16, an antenna 10, multiple microphones 12, a camera 14. In the example of FIG. 1, the control unit 16 may be connected to an electrical component 18 by three different lines. In FIG. 1, these three lines are identified by the respective phases of a three-phase current winding (U, V, W) corresponding to the electrical component. These three different conductors can be connected to the electrical component 18 at respective slip-in coils 20. The control unit 16 can include a high-voltage generator to apply voltage pulses or other voltage signals to the electrical component 18. The electrical component 18 can be a stator. The stator 18 can be a part of an electric drive for a motor vehicle. The test device 100 as well as the control unit 16 in an example may serve for detecting partial discharges 40.

In particular, the partial discharge 40 is to be regarded as a partial discharge in gaseous media between two adjacent conductors, which have a potential difference to each other as well as a low distance to each other. Partial discharges 40 are an undesired phenomenon, which can impair a functionality of the electrical component 18 in the long term. With partial discharges 40, insulations within the electrical component 18 can be abrasively attacked. Mostly, the partial discharges 40 do not yet cause a direct damage, but a failure of the electrical component 18 can become more probable in the long term. This wear can result in a full breakdown, thus short-circuit, in the future. As a result, the electrical component 18 can completely fail. With partial discharges 40, electromagnetic waves 22 as well as acoustic sound waves 24 in particular may occur. The electromagnetic waves 22 can be captured by one or more antennas 10. The antennas 10 can be formed as ultrahigh-frequency antennas (UHF antenna).

The control unit 16 can generate pulse-shaped and/or sinusoidal voltage signals and apply them to the electrical component 18. These voltage signals can be applied to the electrical component 18 via the illustrated conductors U, V, W. In an example, the application of the voltage signal may not result in a partial discharge 40. An occurrence of the partial discharge 40 below a voltage value of a tolerance voltage may be regarded as critical. In this case, a defective electrical component 18 may be assumed. If the voltage value of the voltage signal is above the tolerance voltage, thus, the electrical component 18 may be classified as usable. In an example, the voltage values of the voltage signal may be limited up to a maximum termination voltage. If partial discharges 40 frequently occur beyond the tolerance voltage, thus, a number of voltage signals, which result in the partial discharge 40, can be taken into account for the evaluation. Mostly, the examination of the electrical component 18 for partial discharges 40 may be performed as follows. In the following, the voltage signal may be assumed as a pulsed voltage or voltage pulse.

First, the measuring procedure may be started with a low voltage pulse. This in particular means that a low voltage value is selected for the voltage pulse. If partial discharges 40 do not occur, thus, the test procedure can be again performed with an increased voltage pulse, thus an increased voltage value. This test procedure can be continued until the antennas 10 register a signal (electromagnetic wave 22), which may be above a preset first threshold value. Alternatively or additionally, a second signal can be captured by the multiple microphones 12. If one of these multiple microphones 12 captures a second signal (sound wave 24), which exceeds a second threshold value, thus, a partial discharge 40 can be inferred. In an example, both the first threshold value and the second threshold value may be exceeded as a result of the partial discharge 40. Thus, both the antennas 10 and the microphones 12 can determine the partial discharges 40. In case of the detection of the partial discharge 40, the voltage level, which has caused the partial discharge 40, becomes known due to the applied voltage pulse by the control unit 16. Thereby, a value for a partial discharge start voltage limit can be indicated. From this voltage value, partial discharges 40 can occur in the electrical component 18.

Such a test procedure can be consecutively performed for any one or all of the three phases U, V, W of the electrical component 18. Thus, a corresponding voltage limit value for the partial discharge 40 can be ascertained for each individual phase U, V, W. Usually, the phase with the lowest voltage value may represent the insulating flaw. The test device 100 can additionally include the camera 14. In an example, a light flash can be filmed by the camera 14, which can directly show the location of the partial discharge.

Figure 2:
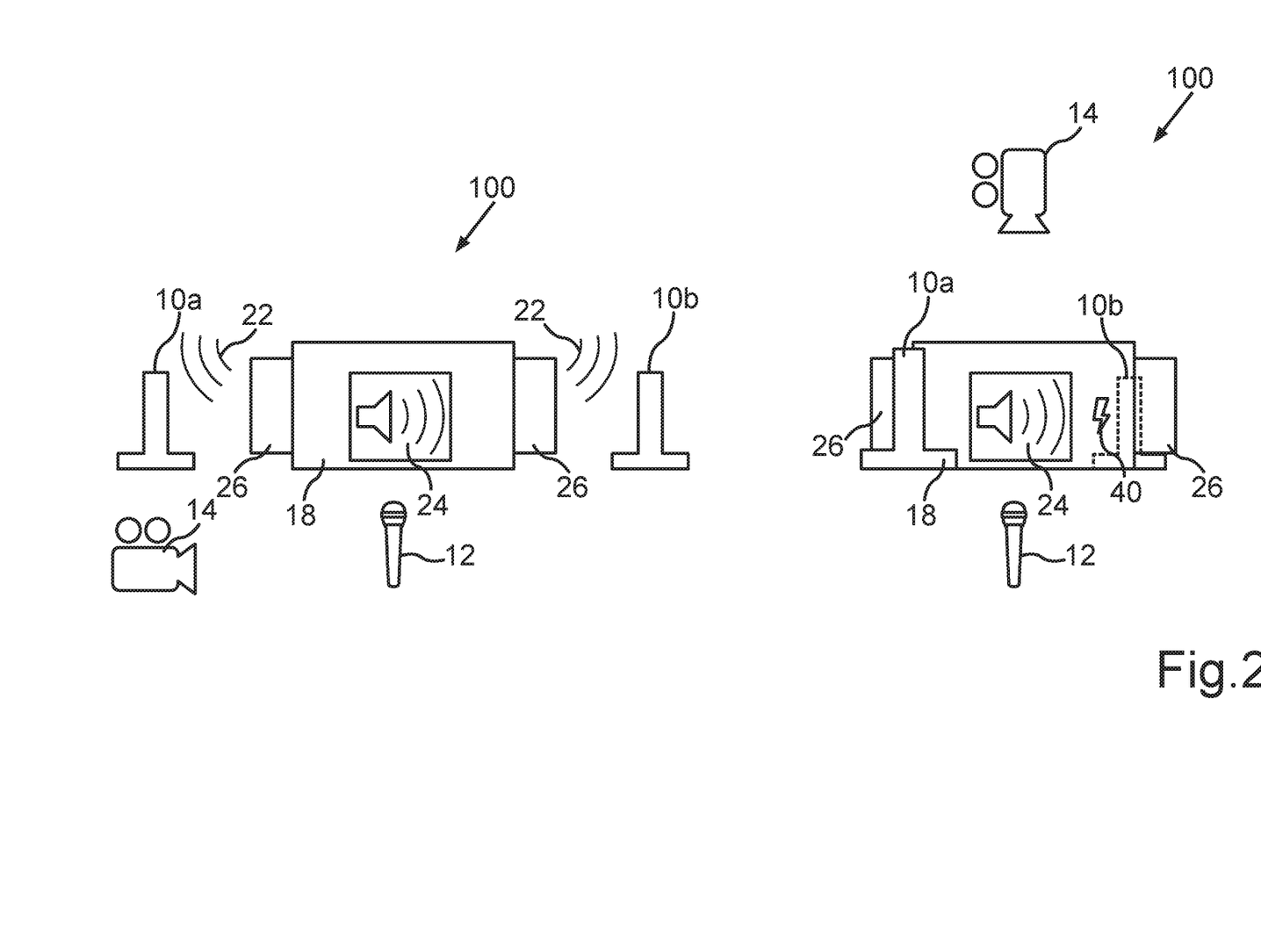
FIG. 2 is diagram two exemplary test devices according to a second and a third example.

In FIG. 2, two further examples for the test device 100 are shown. Both test devices each comprise two antennas 10, which are arranged around the electrical component 18. The left example of FIG. 2 shows antennas 10 arranged offset, that is rotated around the electrical component, in contrast to the right example of FIG. 2. The two antennas 10 in the left example of FIG. 2 may be arranged turned, thus rotated around the electrical component, compared to the right example. Thus, the test devices 100 each comprise a first antenna 10, 10a and a second antenna 10, 10b, respectively.

Alternatively, more than two antennas 10 can be used for detecting the electromagnetic waves 22. The first antenna 10, 10a may be placed on a first side of the electrical component. Correspondingly, the second antenna 10, 10b may be positioned on a second side of the electrical component. The two antennas 10, 10a, and 10, 10b may be positioned in an environment of the windings 26. At the same time, a video film or multiple images of the electrical component 18 can be captured with the aid of the camera 14. The control unit 16 can pick up the signals captured by the multiple antennas 10 as well as multiple microphones 12 and correspondingly evaluate them. The multiple microphones 12 can capture the sound waves 24, which arise by the partial discharges 40. The electromagnetic waves 22 resulting from the partial discharges 40 can be registered by the antennas 10. Based on this signal data as well as in particular on the intensities of these signals, the control unit 16 can ascertain a location of the partial discharge 40 within the electrical component 18. This ascertained location can be visually displayed with the aid of the camera 14. Thereto, a corresponding image can be displayed on a monitor of a test appliance. With only two antennas 10 and without microphone, it can at least be determined, on which side (left or right) of the electrical component 18, the partial discharge 40 occurs. By rotating the two antennas 10a and 10b, the location of the partial discharge 40 can be stated more precisely.

Figure 3:
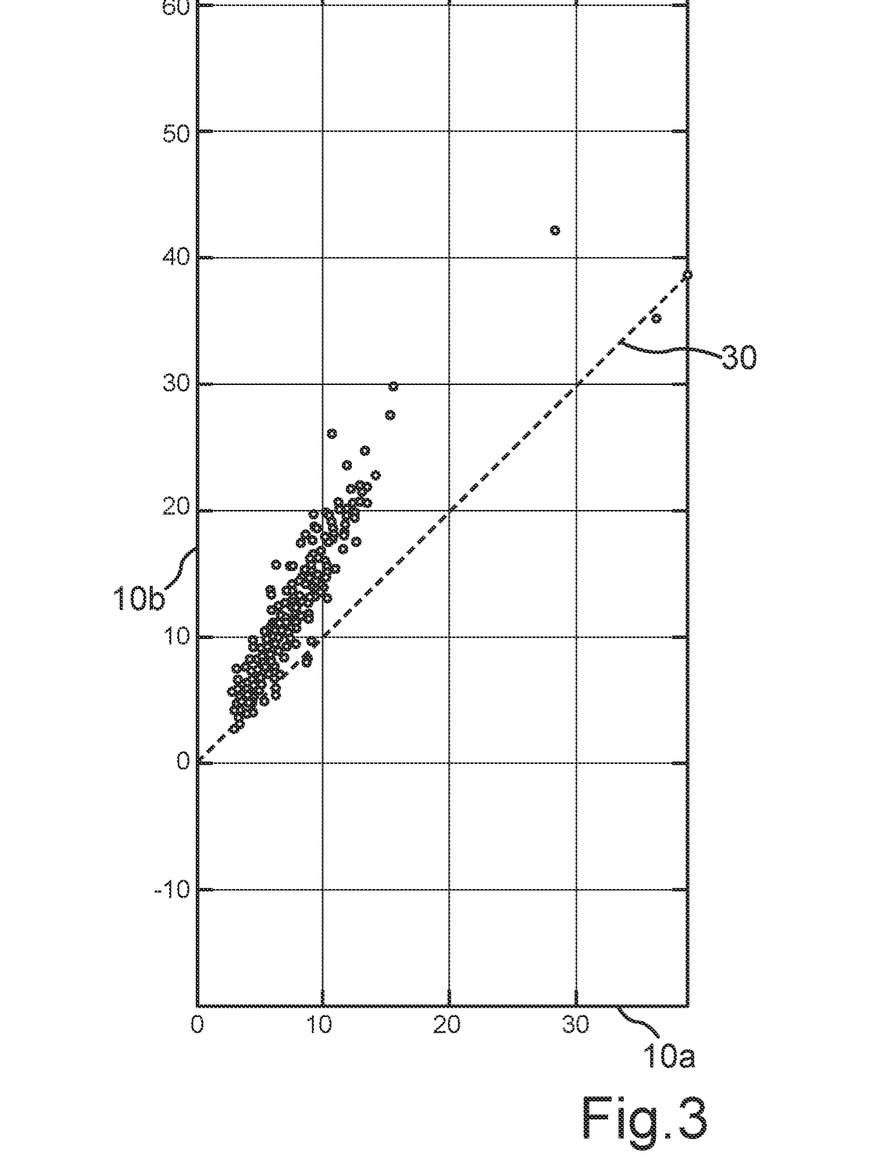
FIG. 3 is a diagram relating to the intensities of electromagnetic waves, which may be registered by two antennas.

In FIG. 3, a possible evaluation by the control unit 16 is exemplarily shown. FIG. 3 shows a diagram, in which amplitudes of the electromagnetic wave 22 caused by the partial discharge 40 may be respectively plotted on the x-axis as well as y-axis. With reference to the right side of FIG. 3, the x-axis shows the first amplitude, which may be registered by the first antenna 10a. Correspondingly, the y-axis shows the second amplitude, which may be measured by the second antenna 10b. A slightly dotted straight line represents a neutral line 30. The neutral line 30 in particular may represent a spatial position of detected partial discharges 40, which may be detected by both antennas 10a, 10b with identical intensity (identical electric field strength). The neutral line 30 can be analogously used on the signals of the microphones 12. In case of the microphones, the intensity would relate to the volume. In the case of FIG. 3, the respectively measured intensities are converted with respect to the background noise (signal-to-noise ratio). The plurality of points in the diagram of FIG. 3 shows that they are arranged on a left side of the neutral line 30. Therefrom, it can be derived that the partial discharge 40 tends to be located on a side of the second antenna 10b. Assuming that FIG. 3 represents the situation on the right in FIG. 2, one can indicate, on which side the partial discharge 40 has tendentially occurred. This would be rather in the right area in the right example of FIG. 2. There, the partial discharge 40 is schematically indicated. In the right example of FIG. 2, the partial discharge 40 is thus tendentially to be searched in a right area of the electrical component 18. Thus, a possible flaw of the electrical component or of the stator 18 can be at least narrowed down. This can facilitate or accelerate a required diagnosis or repair.

Depending on the location of the partial discharge 40, different clusters can form at measurement points. If the partial discharge 40 would be on a left side of the stator 18, thus, most of the measurement points would be seen below the neutral line 30. In addition to this analysis method illustrated in FIG. 3, an evaluation of the transit time differences of the signals (electromagnetic wave 22) registered by the first antenna 10a and the second antenna 10b can be performed. The first antenna 10a receives a signal of the electromagnetic wave 22 at a first point of time, while the second antenna 10b registers a signal of the electromagnetic wave 22 at a second point of time. Due to the transit time difference, these two points of time T1 and T2 may usually not be identical. Depending on this time difference, the control unit 16 can ascertain or at least approximately determine a location for the partial discharge 40. By a repetition of this examination and rotating at the same time, thus turning the two antennas, further information for the localization of the partial discharge 40 can be obtained. Thus, even by only two antennas 10a and 10b, a three-dimensional ascertainment of the location of the partial discharge 40 can be allowed.

The camera 14 shown in FIGS. 1 and 2 can be a video camera and/or acoustic camera. The multiple microphones 12 can be formed as directional microphones. Directional microphones can have a type of key to better capture sound waves. The control unit 16 can include a corresponding software to evaluate the signals captured by the multiple microphones 12 as well as multiple antennas 10 for localizing the location of the partial discharge 40. This evaluation can in particular involve an analysis of the respectively captured intensities by the respective antennas 10 or microphones 12. The location of the partial discharge 40 ascertained by the control unit 16 can be visually presented with the aid of the camera 14. The location of the partial discharge 40 can be directly displayed on a monitor of a test appliance. At the same time, a terminal voltage causing the partial discharge 40 can be indicated by the control unit 16.

In addition, the control unit 16 can each ascertain a first point of time (T1) and a second point of time (T2) for detecting the partial discharge 40. For example, it can be determined, at which point of time the volume captured by the microphones 12 exceeds the second threshold value. Alternatively or additionally, a corresponding point of time can be determined, when the first threshold value is exceeded by one of the multiple antennas 10. With the aid of these points of time, multiple images of the camera 14 can be synchronized. In particular, the images corresponding to the captured points of time can be selected for the visual presentation of the partial discharge 40.

Figure 4:
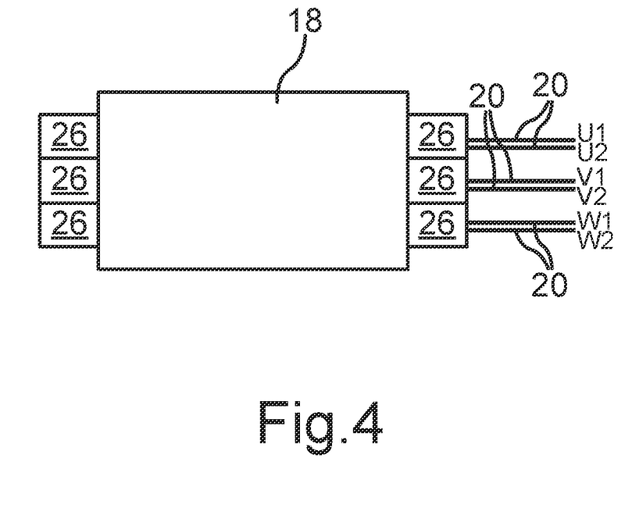
FIG. 4 is an exemplary representation for a stator as an electrical machine with multiple phases.

In FIG. 4, two examples for stators 18 with respectively multiple slip-in coils 20 are shown. The slip-in coils 20 can be referred to as hairpins. However, other connection elements such as for example flat wires, round wires, cable lugs etc. can also be addressed therewith. The respective slip-in coils 20 are associated with a respective phase of the stator in the example of FIG. 4. In the right example of FIG. 4, six parallel branches to different phases are overall indicated. Here, not only a differentiation between the respective phases, but additionally a differentiation with respect to respective parallel branches of the corresponding phase can be performed. The individual phases U, V, W of a hairpin stator 18 according to the right example of FIG. 4 can be composed of more than one conductor connected in parallel. In the right example of FIG. 4, the windings 26 are divided into six different areas. Therein, each two branches may in particular be arranged at a phase. Each of these areas may be accessible with a separate slip-in coil 20. In the hairpin stator 18 according to the right example of FIG. 4, the ends of the conductors connected in parallel can be mechanically separated from each other and be freely accessible for contacting for a measurement. This in particular means that each parallel branch can be analyzed individually to the other branches. Partial areas of the windings 26 can be separately applied with a voltage pulse and be examined with respect to the partial discharge 40. The different phases of the windings 26 may be electrically separated, in particular galvanically separated, from the remaining part of the stator 18. In the right example of FIG. 4, the windings 26 to the left and right of the stator 18 are divided into six different areas.

Each slip-in coil 20 may be connected to a corresponding partial area of the windings 26. This respective partial area may be electrically insulated with respect to the other partial areas. Thus, a voltage pulse can each be applied only to respective partial areas of the windings 26 of the stator 18 by the control unit 16. Thereby, selected partial areas of the windings 26 or of the stator 18 can be separately examined. If the partial discharge 40 is for example detected based on the two slip-in coils W1 and W2, thus, the location of the partial discharge 40 can be narrowed down to the right lower area of the windings 26.

With the aid of a switching matrix, all of the phase pairs of the windings 26 can be consecutively applied with voltage pulses in permutating manner. Thus, each partial area can be separately examined with respect to the occurrence of the partial discharge 40. In the tables 1 to 3, possible switching matrices are exemplarily shown.

TABLE 1

Switching matrix starting from phase U
Measurements phase U

| level 1 | level 2 | level 3 |
| --- | --- | --- |
| U- V, W | U - V | U1 - V1 |
|  | U - V | U1 - V2 |
|  | U - V | U2 - V1 |
|  | U - V | U2 - V2 |
|  | U - W | U1 - W1 |
|  | U - W | U1 - W2 |
|  | U - W | U2 - W1 |
| U- V, W | U - W | U2 - W2 |

TABLE 2

Switching matrix starting from phase V
Measurements phase V

| level 1 | level 2 | level 3 |
| --- | --- | --- |
| V- U, W | V - U | V1 - U1 |
|  | V - U | V1 - U2 |
|  | V - U | V2 - U1 |
|  | V - U | V2 - U2 |
|  | V - W | V1 - W1 |
|  | V - W | V1 - W2 |
|  | V - W | V2 - W1 |
| V- U, W | V - W | V2 - W2 |

TABLE 3

Switching matrix starting from phase W
Measurements phase W

| level 1 | level 2 | level 3 |
| --- | --- | --- |
|  |  | W1 - U1 |
|  |  | W1 - U2 |
|  | W - U | W2 - U1 |
|  |  | W2 - U2 |
| W- U, V |  | W1 - V1 |
|  |  | W1 - V2 |
|  | W - V | W2 - V1 |
|  |  | W2 - V2 |

The levels 1 and 2 each show possible measurements, which can be realized according to the left example of FIG. 4. The slip-in coil pairs shown below level 3 indicate, which measurements are possible with the aid of the right example of FIG. 4. In an example, a voltage pulse may be applied across two different phases of the electrical component 18. If the respective phases U, V, W are divided by multiple partial windings, thus, multiple possibilities of testing the partial areas can correspondingly result. The switching matrix of the control unit 16 can describe an automated measurement procedure.

In the measurements to the phase U, the slip-in coil combinations shown to the level 3 can for example be tested out. The same applies to the slip-in coil combinations to the phase V and phase W. The tables 1, 2, 3 only contain meaningful combinations for slip-in coil pairs for the stator 18 with two parallel conductors per phase. For example, if the partial discharge 40 is registered in a measurement relating to the phases U2, V2, thus, the location of the partial discharge 40 can be narrowed down to the associated phases U2 and V2 already in advance. This realization can additionally be combined with the aid of the evaluation explained in the FIGS. 1 to 3.

Thereby, partial discharges 40 can be early determined in stators 18 already in the development of electric drives. Thus, defective stators 18 can be timely recognized and repaired or sorted out. A functional stator may have a voltage limit, which is high enough to ensure functionality in the normal operation. In particular, with the aid of the described examples, not only a voltage value for the voltage pulse may be ascertained, from which the partial discharge 40 occurs, but moreover the location of the partial discharge 40 may be ascertained and visually presented. With the aid of this location information relating to the partial discharges 40, for example, systematic errors in the production can be early recognized. Therefrom, corresponding measures for improvement can early be taken before further more severe measures would have to follow. A risk of failure of electric drives of electric vehicles can also be minimized. Thus, an important contribution to promoting the electric mobility can be made.

A description has been provided with particular reference to examples, but it will be understood that variations and modifications can be effected within the spirit and scope of the claims, which may include the phrase "at least one of A, B and C" as an alternative expression that refers to one or more of A, B or C, contrary to the holding in Superguide v. DIRECTV, 358 F3d 870, 69 USPQ2d 1865 (Fed. Cir. 2004).

The invention claimed is:

1. A test device to localize a partial discharge in or at an electrical component, the test device comprising:
at least one antenna to respectively capture electromagnetic waves caused by the partial discharge in the electrical component, the at least one antenna positioned in a set environment around the electrical component,
multiple microphones, which are arranged in the set environment around the electrical component, the multiple microphones to capture sound waves caused by the partial discharge,
a control unit configured to,
apply a plurality of voltage signals to at least two phases, from among phases (U, V, W), of a winding, from among plural windings, of the electrical component, according to a switching matrix, to determine the partial discharge, examine if intensity of an electromagnetic wave, from among the electromagnetic waves captured by the at least one antenna, exceeds a first limit value and/or intensity of a sound wave, from among the sound waves, captured by at least one of the multiple microphones exceeds a second limit value, and ascertain a location of the partial discharge from among the at least two phases of the phases (U, V, W), depending on the sound wave captured and/or the electromagnetic wave, and based on the first limit value and/or the second limit value.

2. The test device according to claim 1 with a camera to optically capture the electrical component by an image, wherein the control unit is to, display the location of the partial discharge in the image, ascertain the location of the partial discharge based on the sound wave captured by the multiple microphones, and associate by indicating the location in the image of the camera.

3. The test device according to claim 1, wherein the multiple microphones are arranged on opposing sides of the electrical component and/or circularly around the electrical component, wherein the control unit additionally ascertains the location of the partial discharge depending on a position of a respective microphone, among the multiple microphones, in relation to the electrical component and on a captured volume of a respective sound wave among, from among the sound waves captured.

4. The test device according to claim 1, wherein the control unit is configured to, iteratively incrementally increase a voltage signal, from among the plurality of voltage signals, until an electromagnetic wave captured by one of the at least one antenna exceeds the first limit value or the voltage signal reaches a maximum value, and consider a number of voltage signals, from among the plurality of voltage signals, which generate the partial discharge, to evaluate the electrical component.

5. The test device according to claim 1, wherein, the plurality of voltage signals are applied by applying immediately consecutive voltage signals to the at least two phases of the phases (U, V, W).

6. The test device according to claim 1, wherein the location of the partial discharge is at least approximately ascertained by a respective transit time difference of a sound wave, from among the sound waves.

7. The test device according to claim 1, wherein the at least one antenna includes a first antenna and a second antenna, arranged on opposing sides of the electrical component, and the control unit is to locally at least narrow down the location of the partial discharge based on a captured first intensity of a first electromagnetic wave by the first antenna and a captured second intensity of a second electromagnetic wave by the second antenna.

8. The test device according to claim 1, wherein, a microphone, from among the multiple microphones, is a directional microphone, and/or the at least one antenna is a UHF antenna, and the electrical component is a stator of an electric motor for a motor vehicle.

9. A test device to localize a partial discharge in or at an electrical component, the test device comprising:

multiple antennas respectively capturing electromagnetic waves caused by the partial discharge in the electrical component, the multiple antennas positioned in a set environment around the electrical component, a control unit configured to, apply a plurality of voltage signals to the electrical component, the plurality of voltage signals applied by iteratively incrementally increasing a voltage signal, from among the plurality of voltage signals, to consider a number of voltage signals, from among the plurality of voltage signals, until an intensity of an electromagnetic wave, from among the electromagnetic waves respectively captured by the multiple antennas, exceeds a first limit value, or the voltage signal reaches a maximum value, to determine the partial discharge, and depending on the electromagnetic wave captured and the first limit value, ascertain a location of the partial discharge for localization.

10. The test device according to claim 9 with a camera to optically capture the electrical component by an image, wherein the control unit is to, display the location of the partial discharge in the image, ascertain the location of the partial discharge based on a captured sound wave, from among sound waves captured by multiple microphones, and associate by indicating the location in the image of the camera.

11. A method of localizing a partial discharge in or at an electrical component by a test device, the method by the test device comprising:

applying a plurality of voltage signals to at least two phases, from among phases (U, V, W), of a winding, from among plural windings, of the electrical component, according to a switching matrix, capturing an electromagnetic wave caused by the partial discharge in the electrical component by at least one antenna, capturing sound waves caused by the partial discharge by multiple microphones arranged in a set environment around the electrical component, examining if the electromagnetic wave captured by the at least one antenna exceeds a first limit value, and/or a sound wave captured by one of the multiple microphones exceeds a second limit value, to determine the partial discharge, ascertaining a location of the partial discharge from among the at least two phases of the phases (U, V, W) based on the sound waves and/or the electromagnetic wave and on the first limit value and/or the second limit value.

12. The method according to claim 11, further comprising:

optically capturing, by a camera, an image of the electrical component;

displaying the location of the partial discharge in the image;

ascertaining the location of the partial discharge based on the sound wave of the multiple microphones; and associating by indicating the location in the image of the camera.

13. The test device according to claim 11, further comprising, iteratively incrementally increasing a voltage signal, from among the plurality of voltage signals, until an electromagnetic wave captured by the at least one antenna exceeds the first limit value or the voltage signal reaches a maximum value, and considering a number of voltage signals, from among the plurality of voltage signals, which generate the partial discharge, to evaluate the electrical component.

14. A method of localizing a partial discharge in or at an electrical component by a test device, the method by the test device comprising:
- applying a plurality of voltage signals to the electrical component,
- capturing, by at least one antenna, respective electromagnetic waves caused by the partial discharge in the electrical component,
- the plurality of voltage signals are applied by iteratively incrementally increasing a voltage signal of the plurality of voltage signals to consider a number of voltage signals among the plurality of voltage signals until an intensity of an electromagnetic wave, from among the respective electromagnetic waves captured by at least one antenna, from among multiple antennas, exceeds a first limit value or the voltage signal reaches a maximum value, to determine the partial discharge,
- ascertaining a location of the partial discharge based on the electromagnetic wave captured and on the first limit value, to localize the partial discharge.

15. The method according to claim 14, further comprising:
- optically capturing, by a camera, an image of the electrical component;
- displaying the location of the partial discharge in the image;
- ascertaining the location of the partial discharge based on a captured sound wave, from among sound waves captured by multiple microphones; and
- associating by indicating the location in the image of the camera.

* * * * *